US00RE37441B1

(19) United States
(12) Reissued Patent
Yamazaki

(10) Patent Number: US RE37,441 E
(45) Date of Reissued Patent: Nov. 13, 2001

(54) PHOTOELECTRIC CONVERSION DEVICE

(75) Inventor: Shunpei Yamazaki, Tokyo (JP)

(73) Assignee: Semiconductor Energy Laboratory Co., Ltd., Kanagawa-ken (JP)

(21) Appl. No.: 08/947,732

(22) Filed: Oct. 8, 1997

Related U.S. Patent Documents

Reissue of:
(64) Patent No.: 4,581,476
Issued: Apr. 8, 1986
Appl. No.: 06/564,213
Filed: Dec. 22, 1983

U.S. Applications:
(

(63) Continuation of application No. 08/408,499, filed on Mar. 22, 1995, now abandoned, which is a continuation-in-part of application No. 06/525,459, filed on Aug. 22, 1983, now Pat. No. 4,591,892.

(30) Foreign Application Priority Data

Aug. 24, 1982 (JP) ..... 57-146561
Oct. 18, 1982 (JP) ..... 57-182546
Dec. 23, 1982 (JP) ..... 57-228158

(51) Int. Cl.[7] ..... H01L 31/075

(52) U.S. Cl. ..... 136/258; 136/255; 257/53; 257/55; 257/56; 257/458; 257/463

(58) Field of Search ..... 136/255, 258 AM; 257/53, 55, 56, 458, 463

(56) References Cited

U.S. PATENT DOCUMENTS 2,882,243 4/1959 Milton .
2,971,607 2/1961 Caswell .

(List continued on next page.)

FOREIGN PATENT DOCUMENTS 0180781 5/1986 (EP) ..... 136/258 AM
2130008 9/1985 (GB) .
51-1389 1/1976 (JP) .
54-136274 10/1979 (JP) .
54-158190 12/1979 (JP) .
55-11329 1/1980 (JP) .
55-13939 1/1980 (JP) .
55-29154 3/1980 (JP) .
55-29155 3/1980 (JP) .
53-152887 6/1980 (JP) .

(List continued on next page.)

OTHER PUBLICATIONS

Nikkei Electronics, Zenko Hirose, Dec. 20, 1982, p. 168 (English translation herewith).
Y. Hamakawa, Amorphous Semiconductor Technologies and Devices, pp. 194, 198 (1982).

(List continued on next page.)

*Primary Examiner*—Alan Diamond
(74) *Attorney, Agent, or Firm*—Sixbey, Friedman, Leedom & Ferguson, PC; Eric J. Robinson

(57) ABSTRACT

A photoelectric conversion device has a non-single-crystal semiconductor laminate member formed on a substrate having a conductive surface, and a conductive layer formed on the non-single-crystal semiconductor laminate member. The non-single-crystal semiconductor laminate member has such a structure that a first non-single-crystal semiconductor layer having a P or N first conductivity type, an I-type second non-single-crystal semiconductor layer and a third non-single-crystal semiconductor layer having a second conductivity type opposite the first conductivity type are laminated in this order. The first (or third) non-single-crystal semiconductor layer is disposed on the side on which light is incident, and is P-type. The I-type non-single-crystal semiconductor layer has introduced thereinto a P-type impurity, such as boron which is distributed so that its concentration decreases towards the third (or first) non-single-crystal semiconductor layer in the thickness direction of the I-type layer.

16 Claims, 5 Drawing Sheets

U.S. PATENT DOCUMENTS

| | | | |
|---|---|---|---|
| 3,155,621 | 11/1964 | Cowlard et al. . | |
| 3,462,422 | 8/1969 | Deal . | |
| 3,492,175 | 1/1970 | Conrad et al. . | |
| 3,785,122 | 1/1974 | Yatsurugi et al. . | |
| 3,892,606 | 7/1975 | Chappelow et al. . | |
| 3,982,912 | 9/1976 | Yatsurugi et al. . | |
| 4,064,521 | 12/1977 | Carlson . | |
| 4,109,271 | 8/1978 | Pankove | 257/53 |
| 4,226,898 | 10/1980 | Ovshinsky et al. . | |
| 4,239,554 | 12/1980 | Yamazaki . | |
| 4,409,805 | 10/1983 | Wang . | |
| 4,418,132 | 11/1983 | Yamazaki | 430/57 |
| 4,425,143 | 1/1984 | Nishizawa et al. . | |
| 4,459,163 | 7/1984 | MacDiarmid et al. . | |
| 4,460,670 | 7/1984 | Ogawa et al. | 430/57 |
| 4,469,527 | 9/1984 | Sugano et al. . | |
| 4,471,042 | 9/1984 | Komatsu et al. | 430/64 |
| 4,485,146 | 11/1984 | Mizuhashi . | |
| 4,490,208 | 12/1984 | Tanaka et al. . | |
| 4,520,380 | 5/1985 | Ovshinsky et al. . | |
| 4,549,889 | 10/1985 | Yamazaki . | |
| 4,581,476 | 4/1986 | Yamazaki | 136/258 AM |
| 4,582,395 | 4/1986 | Morozumi . | |
| 4,591,892 | 5/1986 | Yamazaki . | |
| 4,681,984 | 7/1987 | Moeller | 136/258 AM |
| 4,710,786 | 12/1987 | Ovshinsky et al. . | |
| 4,742,012 | 5/1988 | Matsumura et al. . | |
| 4,758,527 | 7/1988 | Yamazaki . | |
| 4,766,477 | 8/1988 | Nakagawa . | |
| 4,843,451 | 6/1989 | Watanabe et al. | 136/258 |
| 4,888,305 | 12/1989 | Yamazaki et al. . | |
| 4,889,782 | 12/1989 | Yamazaki | 430/57 |
| 4,889,783 | 12/1989 | Yamazaki | 430/57 |
| 5,043,772 | 8/1991 | Yamazaki . | |
| 5,077,223 | 12/1991 | Yamazaki | 437/9 |
| 5,294,555 | 3/1994 | Mano et al. . | |
| 5,315,132 | 5/1994 | Yamazaki | 257/66 |
| 5,349,204 | 9/1994 | Yamazaki . | |
| 5,391,893 | 2/1995 | Yamazaki | 257/52 |
| 5,521,400 | 5/1996 | Yamazaki . | |
| 5,543,636 | 8/1996 | Yamazaki . | |

FOREIGN PATENT DOCUMENTS

| | | | |
|---|---|---|---|
| 55-78524 | 6/1980 | (JP) . | |
| 56-4287 | 1/1981 | (JP) . | |
| 56-45083 | 4/1981 | (JP) . | |
| 56-64476 | 6/1981 | (JP) . | |
| 56-135968 | 10/1981 | (JP) . | |
| 57-1272 | 1/1982 | (JP) . | |
| 57-40940 | 3/1982 | (JP) . | |
| 57-146561 | 8/1982 | (JP) . | |
| 57-146562 | 8/1982 | (JP) . | |
| 57-182546 | 10/1982 | (JP) . | |
| 57-187972 | 11/1982 | (JP) . | |
| 58-28873 | 2/1983 | (JP) . | |
| 58-92217 | 6/1983 | (JP) . | |
| 58-92218 | 6/1983 | (JP) . | |
| 58-155774 | 9/1983 | (JP) . | |
| 59-35423 | 2/1984 | (JP) . | |
| 59-35488 | 2/1984 | (JP) . | |
| 57-211098 | 7/1984 | (JP) . | |
| 59-115574 | 7/1984 | (JP) . | |
| 60-96391 | 9/1994 | (JP) . | |
| 57-187972 | 4/1986 | (JP) | 136/258 AM |

OTHER PUBLICATIONS

Expert Report of Morgan (Date Unknown).

Expert Report of Stephen Smith (Date Unknown).

Expert Region of Anthony Catalano (Date Unknown).

Expert Report of Dr. John T. Davies (Date Unknown).

Expert Report of Dr. Bruce E. Deal (Date Unknown).

Expert Report of Stephen J. Fonash (Date Uknown).

Expert Report of Arthur Jonath (Date Uknown).

Initial Expert Report of Harry F. Manbeck, Jr. (Date Uknown).

First Supplemental Expert Report of Harry F. Manbeck, Jr. (Date Uknown).

Second Supplement Expert Report of Harry F. Manbeck, Jr. (Date Unknown).

Expert Report of Jan E. A. Maurits (Date Unknown).

Initial Expert Report of Bernard S. Meyerson (Date Unknown).

Expert Region of Douglas Ruthven (Date Unknown).

Expert Report of P. Warren Vidrine (Date Unknown).

Expert Report of Christopher R. Wronski (Date Unknown).

Second Declaration by Dr. Yamazaki (Date Unknown).

Notice of Samsung's Motion for Summary Judgment Declaring U.S. Patent No. 5,543,636 Invalid for Failure to Enable (Date Unknown).

Defendant's Motion for Summary Judgment Declaring U.S. Patent No. 5,543,636 Invalid for Failure to Enable (Date Unknown).

Memorandum in Support of Defendants' Motion for Summary Judgement Declaring U.S. Patent 5,543,636 Invalid for Failure to Enable (Date Unknown).

Semiconductor Energy Laboratory, Co., Ltd.'s Memorandum in Opposition to Defendants' Motion for Summary Judgement Declaring U.S. Patent No. 5,543,636 Invalid for Failure to Enable (Date Uknown).

Defendants' Reply in Support of Motion for Summary Judgment Declaring U.S. Patent No. 5,543,636 for Failure to Enable Date (Unknown).

Declaration of Dr. Shunpei Yamazaki (Date Unknown).

Memorandum in Support of Samsung's Motion for Summary Judgement Declaring U.S. Patent 5,543,636 Invalid as Obvious Under 35 U.S.C. 103 (Date Unknown).

Memorandum in Support of Defendant's Motion for Summary Judgment Declaring U.S. Patent 5,543,636 Invalid for Failure to Disclose Best Mode (Date Unknown).

Notice of SEL's Motion for Summary Judgment Dismissing Samsung's Inequitable Conduct Defense to the '636 Patent (Date Unknown).

Motion for Summary Judgement Dismissing Samsung's Inequitable Conduct Defence to the '636 Patent (Date Unknown).

Memorandum of Law in Support of SEL's Motion for Summary Judgment Dismissing Samsung's Inequitable Conduct Defence to the '636 Patent (Date Unknown).

Declaration of Robert Cote in Support of SEL's Motion for Summary Judgment Dismissing Samsung's Inequitable Conduct Defense to the '636 Patent (Date Unknown).

Declaration of Gerald J. Ferguson, Jr. (Date Unknown).

Second Declaration of Gerald J. Ferguson, Jr. (Date Unknown).

Rebuttal Report of Gerald Lucovsky (Date Unknown).

Rebuttal to Catalano Report by Dr. Magee (Date Unknown).

Uchida et al., "Large Area Amorphous Silicon Solar Cell", Denshi Zairyou, Jan. 1980, pp. 75–81.

Hirose, "Amorphous Silicon Material", Denshi Zairyou, Jan. 1981, pp. 56–58.

Scilla et al., Determination of Metallic Impurities in a–Si:H by SIMS, Surface and Interface Analysis, vol. 4, No. 6, 1982, pp. 253–254.

Japanese Patent Document 57–13777 with English translation published Jan. 23, 1982, Japan.

Supplement Expert Report of Catalano (Date Unknown).

Szydlo et al., "High Current Post–Hydrogenated Chemical Vapor Deposited Amorphous Silicon PIN Diodes", pp. 988–990, Jun. 1, 1992 (cited in Supplemental Expert Region of Catalano).

Kamei et al., "Deposition and Extensive Light Soaking of Highly Pure Hydrogenated Amorphous Silicon", pp. 2380–2382, Apr. 22, 1996 (cited in Supplemental Expert Report of Catalano).

First Amended Expert Report of Stephen J. Fonash (Date Unknown).

First Supplemental Expert Report of Fonash (Date Unknown).

Rebuttal Expert Report of Fonash (Date Unknown).

Revised Expert Report of Ruthven (Date Unknown).

Revised Expert Report of Maurits (Date Unknown).

Second Supplemental Expert Report of Morgan (Date Unknown).

First Supplemental Expert Report of Smith (Date Unknown).

First Amended and Supplemental Expert Report of Deal (Date Unknown).

Memorandum Opinion Published Apr. 15, 1998, of Judge T.S. Ellis, III in C.A. No. 96–1460–A attached to IDS as Exhibit C.

Applicant SEL's Motion for Reconsideration, with exhibits A–N. (Date Unknown).

Documents discussed in Judge Ellis' opinion—Japanese Patent Document 56–135968 (Canon '968) attached to IDS as Exhibit D. Oct. 1981.

Documents discussed in Judge Ellis' opinion—Partial translation of Japanese Patent Document 56–135968 (Canon '968) attached to IDS as Exhibit E. (Date Unknown).

Documents discussed in Judge Ellis' opinion—Full translation of Japanese Patent Document 56–135968 (Canon '968) attached to IDS as Exhibit F. (Date Unknown).

Documents discussed in Judge Ellis' opinion—C.C. Tsai, et al., "Amorphous Si Prepared in a UHV Plasma Deposition System", Journal on Non–Crystalline Solids, Proceedings of the Tenth International Conference on Amorphous and Liquid Semiconductors in Tokyo, vol. 59&60, pp. 731–734 (1983) attached to IDS as Exhibit G.

Documents discussed in Judge Ellis' opinion—Japanese Patent Document 59–35423 (the '423 reference) attached to IDS as Exhibit H. Feb. 1984.

Documents discussed in Judge Ellis' opinion—Japanese Patent Document 59–35488 (the '488 reference) attached to IDS as Exhibit I. Feb. 1984.

Documents discussed in Judge Ellis' opinion—U.S. patent 5,521,400 to Yamazaki (the '400 patent) attached to IDS as Exhibit J. May 1996.

Documents discussed in Judge Ellis' opinion—Japanese Patent Document 58–2073 (the Sony 2073 reference) attached to IDS as Exhibit K. Jan. 1983.

Documents discussed in Judge Ellis' opinion—Presentation materials from speech by Dr. Yamazaki in Reston, Virginia in May, 1983 attached to IDS as Exhibit L.

Complete copy of transcripts from hearing, including transcripts from Mar. 17–19, 1998; Mar. 31, 1998; Apr. 1–3, 1998; Apr. 6, 1998; and Apr. 9, 1998.

Yamazaki Deposition Transcript, pp. 509–527. (Date Unknown).

Yamazaki Deposition Transcript, pp. 410–415. (Date Unknown).

D. Carlson, "The Effects of Impurities and Temperature on Amorphous Silicon Solar Cells", IEEE Technical Digest for the 1977 IEDM in Washington, D.C., pp. 214–217 (IEEE New York, 1977).

A. Delahoy and R. Griffith, "Impurities Effects in a–Si:H Solar Cells Due to Air, Oxygen, Nitrogen, Phosphine, or Monochlorosilane in the Plasma", Journal of Applied Physics, vol. 52, No. 10, pp. 6337–6346 (1981).

P. Vanier, et al., "Study of Gap States in a–Si:H Alloys by Measurements of Photoconductivity and Spectral Response of MIS Solar Cells", American Institute of Physics, Proceedings of the International Conference on Tetrahedrally Bonded Amorphous Semiconductors, Carefree, Arizona, pp. 237–232 (1981).

P. Vanier, et al., "New Features of the Temperature Dependence of Photoconductivity in Plasma–Deposited Hydrogenated Amorphous Silicon Alloys", Journal of Applied Physics, vol. 52, No. 8, pp. 5235–5242 (1981).

A. Delahoy, et al., "Impurity Effects in a–Si:H Solar Cells", IEEE Proceedings of the 15th Photovoltaic Specialists Conference, Kissimmee, Florida, pp. 704–712 (1981).

R. Corderman, et al., "Mass Spectrometric Studies of Impurities of Silane and Their Effects on the Electronic Properties of Hydrogenated Amorphous Silicon", Journal of Applied Phyusics, vol. 54, No. 7, pp. 3987–3992 (1983), submitted Sep., 1982.

D. Carlson, et al. Quarterly Report No. 2, SERI/PR–8254–1–T2, prepared under subcontract No. XJ–9–8254, pp. i–66 (Mar. 1980).

D. Carlson et al., Quarterly Report No. 4, SERI/PR–0–9372–4, prepared under subcontract No. XG–0–9372–1, pp. i–33 (Nov. 1981).

The prior work of C.C. Tsai as evidenced by the document: C.C.Tsai, et al., "Amorphous Si Prepared in as UHV Plasma Deposition System", Journal on Non–Crystalline Solids, Proceedings of the Tenth International Conference on Amorphous and Liquid Semiconductors in Tokyo, vols. 59&60, pp. 731–734 (1983).

Z. Hirose, "Amorphous Silicon", *Nikkei Electronics*—Special Issue, pp. 163–179 (Dec. 20, 1982).

J. Lorenz, "A Survey of the Preparation, Purity and Availability of Silanes", prepared under subcontract No. CL–3–00321–01, pp. i–73 (Dec. 1983), including the references cited on pp. 15–18.

Yusa, et al., "Ultrahigh Purification of Silane for Semiconductor Silicon", Journal of the Electrochemical Society: Solid–State Science and Technology, vol. 122, No. 12, pp. 1700–1705 (1975).

Molecular sieve, zeolite and/or Zeoram documentaion (SEL00217997–SEL00218001). (Date Unknown).

T. Takaishi, et al., "Changes in the Sieving Action and Thermal Stability of Zeolite a Produced by Ion–Exchange", Journal of the Chemical Society: Faraday Transactions I, part. 1, pp. 97–105 (1975).

Exhibit B, Sanyo AM1504B cross–sectional diagram and concentrations. (Date Unknown).

Exhibit C, Sanyo SA5511–46 cross–sectional diagram and concentrations. (Date Unknown).

Exhibit D, Sanyo AM1408 cross–sectional diagram and concentrations. (Date Unknown).

Exhibit E, Lockheed D1435 cross–sectional diagram and concentrations. (Date Unknown).

Exhibit F, Lockheed 1353 solar cell, cross–sectional diagram and concentrations. (Date Unknown).

D. Carlson, "Amorphous Thin Films for Terrestrial Solar Cells", D.E. Carlson, Journal of Vacuum Science Technology, vol. 20, No. 3, pp. 290–295 (Mar. 1982).

C. Magee and D. Carlson, "Investigation of the Hydrogen and Impurity Contents of Amorphous Silicon by Seconary Ion Mass Spectrometry", *Solar Cells*, vol. 2, pp. 365–376 (1980).

Aug. 29, 1985 Amendment to U.S. Patent Application 06/525,459, pp. 5 and 6.

Zeolite documentation from Union Carbide (SEC014384–SEC014387). (Date Unknown).

A. Delahoy and R. Griffity, "Impurities Effects in a–Si:H Solar Cells Due to Air, Oxygen, Nitrogen, Phosphine, or Monochlorosilane in the Plasma", Journal of Applied Physics, vol. 52, No. 10, pp. 6337–6346 (1981).

Yamazaki Deposition Transcript, p. 601, line 23 through p. 602, line 2. (Date Unknown).

Admitted prior art transistor structure, Exhibit 49 of Yamazaki Deposition. Yamazaki Deposition transcript, p. 560, lines 13–14; p. 561, lines 16–17. (Date Unknown).

W. Spear, et al., "Doping of Amorphous Silicon by Alkali Ion Implantations", Philosophical Magazine B, vol. 39, No. 2, pp. 159–165 (1979).

Exhibit G, Sharp EL865 cross–sectional diagram and concentrations. (Date Unknown).

Exhibit H, Sharp EL875 cross–sectional diagram and concentrations. (Date Unknown).

R. Kriegler, et al., "The Effect of HCl and $Cl_2$ on the Thermal Oxidation of Silicon", Journal of Electrochemical Society: Solid–State Science and Technology, p. 388–392 (1972).

D.E. Carlson, et al., "Research on High–Efficiency, Single–Junction, Monolithic, Thin–Film a–Si Solar Cells," Subcontract Report SERI/STR–211–2813 (1985).

S. Sze, "Physics of Semiconductor Devices", John Wiley & Sons, pp. 567–571 (1969).

H. Tuan, "Amorphous Silicon Thin Film Transistor and its Applications to Large–Area Electronics", Materials Research Society Symposia Proceedings, vol. 33, pp. 247–257 (1984).

Jun. 7, 1995 Preliminary Amendment to U.S. Patent Application 08/473,953, p. 5.

K. Harii et al., "Self–Alignment Type a–Si:H TFT", 27p–L–16, Extended Abstract of the Japanese Applied Physics Society (Sep. 27, 1983).

May 23, 1993 Amendments in U.S. Patent Application 07/987,179.

C.C. Tsai, "Impurities in Bulk a–Si:H, Silicon Nitride, and at the a–Si:H/Silicon Nitride Interface", Material Research Society Symposia Proceedings, vol. 33, pp. 297–300 (1984).

H. Tuan, "Amorphous Silicon Thin Film Transistor and its Applications to Large–Area Electronics", Material Research Society Symposia Proceedings, vol. 33, pp. 247–257 (1984).

Tsai et al., "Amorphous Si Prepared in a UHV Plasma Deposition System", Journal of Non–Crystalline Solids, Proceedings of the Tenth International Conference on Amorphous and Liquid Semiconductors in Tokyo, vol. 59 & 60, pp. 731–734 (1983).

Apr. 20, 1995 Preliminary Amendment and IDS in U.S. Patent Application 08/214,494; Nov. 25, 1994 Amendment in US Patent Appl 08/214,494.

E.H. Snow, A.S. Grove, B.E. Deal; J. Appl. Phys., vol. 36, No. 5, pp. 1664–1673, Published 1965, "Ion Transport Phenomena in Insulating Films".

A.S. Grove, P. Lamond, et al.; Electro–Technology, p. 40–43, Published 1965; "Stable MOS Transistors".

B. Yurash and B.E. Deal; J. Electrochem. Soc., 15, 1191, Published 1968; "A Method for Determining Sodium Content of Semiconductor Processing Materials".

E.H. Nicollian and J.R. Brews, MOS (Metal–Oxide–Semiconductor) Physics and Technology, Chap. 5, "Control of Oxide Charges", pp. 754–775, 1982.

P.F. Schmidt, Solid–State Tech., 26(6), 147, 1983; "Furnace Contamination and its Remedies".

S. Mayo, J. Appl. Phys., 47, 4012, 1976.

J.R. Davis, Instabilities in MOS Devices, Chap. 4, "Mobile Ions", pp. 65–81, 1981.

P.F. Schmidt and C.W. Pearce, J. Electrochem. Soc., 128, pp. 630–636, 1981; "A Neutron Activation Analysis Study of the Sources of Transition Group Metal Contamination in the Silicon Device Manufacturing Process".

R.W. Lee, J. Chem. Phys., vol. 38, No. 2, pp. 448–455, 1963; "Diffusion of Hydrogen in Natural and Synthetic Fused Quartz".

G. Hetherington and L.W. Bell, Phys. Chem. Glasses, vol. 8, No. 5, pp. 206–208, Oct. 1967; "Letter to the Editor".

R.J. Kriegler et al., J. Electrochem. Soc., 119, 388, 1972; "The Effect of HCL and $CL_2$ on the Thermal Oxidation of Silicon".

R.J. Kriegler, Proc. Semiconductor Silicon 1973, The Electrochemical Society, Princeton, N.J., p. 363, 1973.

R.R. Hoffmeister, Wright–Patterson AFB Report No. GE–EE 74–24, pp. 56–71, 1974.

S. Mayo and W.H. Evans, J. Electrochem. Soc., 124, pp. 780–785, 1977; "Development of Sodium Contamination in Semiconductor Oxidation Atmospheres at 1000° C.".

B.E. Deal, Jap. J. Appl. Phys., 16(Suppl. 16–1), pp. 29–35, 1977; "Invited: New Developments in Materials and Processing Aspects of Silicon Device Technology".

H. Dersch, J. Stuke and J. Beichler; Phys. Stat. Sol.(b)105, 265, 1981 "Electron Spin Resonance of Doped Glow–Discharge Amorphous Silicon".

M. Stutzmann, et al., Phys. Rev. 32, pp. 23, 1985, "Light–Induced Metastable Defects in Hydrogenated Amorphous Silicon—A Systematic Study".

J. Knights, et al., "Phys. Rev. Lett., 39, 712, 1977" pp. 279–284 (1980) "Electronic and Structural Properties of Plasma–Deposited a–Si:O:H—The Story of $O_2$".

W. Beyer and R. Fisher, Appl. Phys. Lett., 31, 850, 1977.

J. Knights, R. Street, and G. Lucovski, Journal of Non–Crystalline Solids, 35&36, 279–284, 1980.

R.B. Swaroop, "Advances in Silicon Technology for the Semiconductor Industry", Solid State Technology, 1983, pp. 111–114.

R. Crandall, D. Carlson, and H. Weakleam, Applied Physics Letters., vol. 44, pp. 200–201, 1984 "Role of Carbon in Hydrogenated Amorphous Silicon Solar Cell Degradation".

G. Scilla and G. Ceaser, Xerox Corporation Reported, "Determination on Metallic Impurities in a–Si:H by SIMS" Surface and Interface Analysis, vol. 4, No. 6, 1982.
R. Colclaser, Wiley, "Microelectronics: Processing and Device Design", 1980, pp. 94 & 225.
A. Delahoy and R. Griffith, Proceeding of the 15th IEEE Photovoltaics Specialists Conference, IEEE Press, pp. 704–712, 1981, "Impurity Effects in a–Si:H Solar Cells".
S. Sze, "Physics of Semiconductor Devices", Div. of John Wiley & Sons, 1981, pp. 22 and 363–424.
M. Hirose, In Hydrogenated Amorphous Silicon, Semiconductors and Semimetals Series, vol. 21, 1984, p. 29.
Paesler et al., Phys. Rev. Lett., 41, 1492, 1978, "New Development in the Study of Amorphous Silicon Hydrogen Alloys: The Story of O".
Y. Matsushita et al., Jap. J. Appl. Phys. 19, L101, 1980, "A Study on Thermally Induced Mircodefects in Czochralski–Grown Silicon Crystals: Dependence on Annealing Temperature and Starting Materials".
J. Leroueille, Physics Stat. Sol. (A)67, 177, 1981, "Influence of Carbon on Oxygen Behavior in Silicon".
D. Staebler, R. Crandall, and R. Williams, "Stability Tests on p–i–n Amorphous Silicon Solar Cells", Conference Record of the 15th IEEE Photovoltaic Specialists Conference, 249–250, 1981.
H. Branz, "Hydrogen Collision Model of Light–Induced Metastability in Hydrogenated Amorphous Silicon", Solid State Communications, in Press, Sep. 1997.
S. Guha, Conference Record of the 25th Photovoltaics Specialists Conference, pp. 1017–1022, IEEE Press, 1996, "Amorphous Silicon Alloy Solar Cells and Modules—Opportunities and Challenges".
J. Pankove, Hydrogenated Amorphous Silicon, vol. 21, A,B,C,D, Semiconductors and Semimetals Series, Academic Press, 1984, p. 29.
B. Ali Khan and R. Pandya, "Activation Energy of Source–Drain Current in Hydrogenated and Unhydrogenated Polysilicon Thin–Film Transistors", IEEE Transactions on Electron Devices, vol. 37, No. 7, Jul. 1990.
A. Pecora et al., "Off–Current in Polycrystalline Silicon Thin Film Transistors: An Analysis of the Thermally Generated Component", Solid–State Electronics, vol. 38, No. 4, pp. 845–850, (1995).
D. Passoja et al., Some Aspects of the Structure–Properties Relationships Associated with Haze in SOS, Journal of Crystal Growth, vol. 58, 1982, pp. 44–52.
Silicon on Sapphire, Update II, Union Carbide, Bulletin 1980, F–EMG–5801–4M, 4 pages.
T.J. Donahue et al., PECVD of Silicon Epitaxial Layers, Semiconductor International, Aug. 1985, pp. 142–146.
R.P. Roberge et al., Gaseous Impurity Effects in Silicon Epitaxy, Semiconductor International, Jan. 1987, pp. 77–81.
S.K. Iya, Production of Ultra–High–Purity Polycrystalline Silicon, Journal of Crystal Growth, vol. 75, 1986, pp. 88–90.
P.A. Taylor, Purification Techniques and Analytical Methods for Gaseous and Metallic Impurities in High–Purity Silane, Journal Crystal Growth, vol. 89, 1988, pp. 28–38.
A. Yusa et al., Ultrahigh Purification of Silane for Semiconductor Silicon, Journal of the Electrochemical Society, vol. 122, No. 12, Dec. 1975, pp. 1700–1705.
G. Robertson, et al., Boron–Free Silicon Detectors, Final Report of Sep. 1984 to Jun. 1988, Wright Research and Development Center, Materials Laboratory, WRDC–TR–90–4079, Sep. 1990, pp. 121–131.
J. Maurits et al., Abstracts of the Electrochemical Society, 90–2, 1990.
J. Lorentz, A Survey of the Preparation, Purity, and Availability of Silanes, a Subcontract Report, Solar Energy Research Institute, SERI STR–211–2092, Dec. 1983, pp. 1–73.
J. Lorentz, Monosilane and Disilane: 1984 Status Report, a Subcontract Report, Solar Energy Research Institute, SERI STR–211–2575, Mar. 1985, pp. 1–34.
Silicon Source Gases for Chemical Vapor Deposition, Solid State Technology, May 1989, pp. 143–147.
R. Coderman et al., Mass Spectrometric Studies of Impurities in Silane and Their Effects on the Electronics Properties of Hydrogenated Amorphous Silicon, J. Appl. Phys., vol. 54, No. 7, Jul. 1983, pp. 3987–3992.
C. Magee et al., Investigation of the Hydrogen and Impurity Contents of Amorphous Silicon by Secondary Ion Mass Spectrometry, Solar Cells, vol. 2, 1980, pp. 365–376.
T. Takahashi et al., Instrumentation, 47, 3, (1976).
P. Schmidt, Contamination–Free High Temperature Treatment of Silicon or Other Materials, J. Electrochem. Soc.: Solid–State Science and Technology, Jan. 1983, pp. 186–189.
J. Maurits et al., The Effect of Polysilicon Impurities on Minority Carrier Lifetime in CZ Silicon Crystals, 22nd IEEE Photovoltaic Specialists Conference, Oct. 1991, pp. 309–314.
Silane Specifications, Union Carbide, Revised Nov. 22, 1985, 1 page.
Polysilicon Evaluation Report, Union Carbide Corp., Mar. 19, 1985, 1 page.
J.E.A. Maurits, SOS Wafers—Some Comparisons to Silicon Wafers, IEEE Transactions on Electron Devices, vol. ED–25, No. 8, Aug. 1978, pp. 359–363.
J.E.A. Maurits, Problems and Solutions in the Preparation of SOS Wafers, Solid State Technoloty, Apr. 1977, 6 pages.
T. Deacon, Silicon Epitaxy: An Overview, Microelectronic Manufacturing and Testing, Sep. 1984, pp. 89–92.
H. Boyd, Non–Contaminating Gas Containment, Control, and Delivery Systems for VLSI–Class Wafer Fabrication, Microelectronic Manufacturing and Testing, Mar. 1984, pp. 1–6.
J. L. Briesacher et al., Gas Purification and Measurement at the PPT Level, J. Electrochem. Soc., vol. 138, No. 12, Dec. 1991, pp. 3717–3718 and 3723.
A. Homyak et al., Delivering Hydrogen to Meet < 1 ppb Impurity Levels Without the Use of Purifiers, Solid State Technology, Gas Handling and Delivery, Oct. 1995, 4 pages.
Standard Test Method for Interstitial Atomic Oxygen Content of Silicon by Infrared Absorption, ASTM Designation: F 1188–93a, pp. 471–472 (Date Unknown).
Standard Test Method for Substitutional Atomic Carbon Content of Silicon by Infrared Absorption, ASTM Designation: F 1391—93, pp. 471–472 (Date Unknown).
A. Stock and C, Ber. 55, 3961, (1922).
H.J. Emeleus, et al., The Oxidation of the Silicon Hydrides, Part I, Imperial College, S.W. 7., Jun. 27, 1935, pp. 1182–1189.
H.J. Emeleus and K. Stewart, J. Chem. Soc. PP 1182, (1936).
W. Shockley, Transistor Electronics: Imperfections, Unipolar and Analog Transisters*, Proceedings of the I.R.E., Nov. 1952, pp. 1289–1313.

C. Magee et al., Investigation of the Hydrogen and Impurity Contents of Amorphous Silicon by Secondary Ion Mass Spectrometry*, Solar Cells, 2, (1980), pp. 365–376.

R.S. Crandall et al., Appl. Phys. Letters, 44(2), pp. 200–201, (1984).

K.A. Dumas et al., Characterization of HEM Silicon for Solar Cells, Conference Record of the 15th IEEE Photovoltaic Specialists Conference, 1981, pp. 954–958.

T. Saito et al., A New Directional Solidification Technique for Polycrystalline Solar Grade Silicon, Conference Record of the 15th IEEE Photovoltaic Specialists Conference, 1981, pp. 576–580.

T. Nozaki, Concentration and Behavior of Carbon in Semiconductor Silicon, J. Electrochemical Soc. Solid State Science, vol. 117, No. 12, Dec. 1970, pp. 1566–1568.

D.E. Carlson et al., The Effect of Fluorine on the Performance of Amprphous Silicon Solar Cells, Conference Record of the 15th IEEE Photovoltaic Specialists Conference, 1981, pp. 694–697.

T.F. Ciszek et al., Growth of Silicon Sheets from Metallurgical–Grade Silicon, Conference Record of the 15th IEEE Photovoltaic Specialists Conference, 1981, pp. 581–588.

A.E. Delahoy et al., Impurity Effects in α–Si:H Solar Cells Due to Air, Oxygen, Nitrogen, Phosphine, or Monochiorosllane in the Plasma, Journal of Applied Physics, vol. 52, No. 10, Oct. 1981, pp. 6337–6347.

R.E. Griffith, et al., Advanced Amorphous Materials for Photovoltaic Conversion, Semiannual Repoert, Oct. 1, 1979–Mar. 31, 1980, Department of Energy and Environment, Brookhaven National Laboratory, pp. 1–33.

A.E. Delahoy et al., Impurity Effects in α–Si:H Solar Cells, Conference Record of the 15th IEEE Photovoltaic Specialists Conference, 1981, pp. 704–712.

P.G. LeComber et al., Electrical and Photoconductive Properties of Ion Implanted Amorphous Silicon, Journal of Non–Crystalline Solids, 35 & 36, 1980, pp. 327–332.

Charles Feldman, et al., Vacuum Deposited Polycrystalline Silicon Solar Cells for Terrestrial Use, The Conference Record of the 14th IEEE Photovoltaic Specialists Conference, 1980, pp. 391–396.

J.I. Hanoka, et al., Efficient Polycrystalline Solar Cells Made from Low–Cost Refined Metallurgical Silicon, The Conference Record of the 13th IEEE Photovoltaic Specialists Conference, 1978, pp. 485–489.

W.E. Spear et al., Doping of Amorphous Silicon by Alkali–Ion Implantations, Philosophical Magazine B, vol. 39, No. 2, 1979, pp. 159–165.

R.A. Gibson et al., J. Non–Crystalline Solids 35 & 36, pp. 725–730, 1980.

T.I. Kamins et al., MOSFETS in Laser–Recrystallizedpoly–Silicon on Quartz, IEEE Electron Device Letters, vol. EDL–1, No. 10, Oct. 1980, pp. 214–216.

R.S. Sussmann et al., Laser Annealing of Glow Discharge Amorphous Silicon, J. Non–Crystalline Solids, 35 & 36, 1980, pp. 249–254.

S. Onga et al., Characterization of Polycrystalline Silicon MOS Transistors, Japanese Journal of Applied Phyusics, vol. 21, No. 10, Oct., 1982, pp. 1472–1478.

S. Yamazaki et al., An Amorphous Silicon Solar Cell Having a Converstion Efficiency of 10.50 Percent, IEEE Electron Device Letters, vol. EDL–5, No. 8, Aug. 1984, pp. 315–318.

C.C. Tsai et al.,Clean α–Si:H Prepared in a UHV System, Journal of Non–Crystalline Solids, 66 1984, pp. 45–50.

M. Ohnishi et al., Preparation and Photovoltaic Characteristics of α–Si Solar Cells Produced by Consecutive, Separated Reaction Chamber Method, Japanese Journal of Applied Physics, Vo. 21, 1982, Supplement 21–2, pp. 231–237.

O. Tsuji et al., Proceedings of the 6th International Symposium on Plasma Chemistry, vol. 3, pp. 782–786, 1983.

Y. Kuwano, et al., Preparation and Properties of Amorphous Silicon Produced by a Consecutive, Separated Reaction Chamber Method, Japanese Journal of Applied Physics, vol. 21, No. 3, Mar. 1982, pp. 413–417.

P.A. Iles et al., Effect of Impurity Doping Concentration on Solar Cell Output, 11th IEEE Photovoltaic Spec. Conf., 1982, pp. 19–24.

P. Sichanugrist et al., Amorphous Silicon Solar Cells with Graded Boron–Doped Active Layers, Journal Applied Physics, vol. 54, No. 11, Nov. 1983, pp. 6705–6707.

N. Szydlo et al., High Current Post–Hydrogenated Chemical Vapor Deposited Amorphous Silicon P–I–N Diodes, Applied Physics Letters, vol. 40, No. 11, Jun. 1982, pp. 988–990.

K. Katoh et al., Amorphous–Silicon Silicon–Nitride Field–Effect Transistors, Electronics, Letters, vol. 18, No. 14, May 26, 1982, pp. 599–600.

M. Matsumura, (Invited) Amorphous Silicon Transistors and Integrated Circuits, Japanese Journal of Applied Physics, vol. 22, Supplement 22–1, 1983, pp. 487–491.

P.G. LeComber et al., Amorphous–Silicon Field–Effect Device and Possible Application, Electronics Letters, vol. 15, No. 6, Mar. 15, 1979, pp. 179–181.

H.C. Tuan, Amorphous Silicon Thin Film Transistor and Its Applications to Large Area Electronics, Materials Research, Society, Symp. Proc. vol. 33, 1984, pp. 247–257.

C.C. Tsai et al., Impurities in Bulk α–Si:H, Silicon Nitride, and at the α–Si:H/Silicon Nitride Interface, Mat. Res. Soc. Symp. Proc. vol. 33, 1984, pp. 297–300.

H. Fritzsche, Characterization of Glow–Discharge Deposited α–Sil:H, Soler Energy Materials 3 1980, pp. 447–501.

R.S. Sussmann et al., J. Non–Crystalline Solids, 35 & 36, pp. 249–254, 1980.

M. Hirose et al., Defect Compensation in Doped CVD Amorphous Silicon, Journal of Non–Crystalline Solids, 35 & 36, 1980, pp. 297–302.

J. Ishikawa et al., The Effects of Oxygen, Hydrogen and Fluorine on the Conductivity of High Purity Evaporated Amorphous Silicon Films, Journal of Non–Crystalline Solids, 45, 1981, pp. 271–281.

N. Sol et al., J. Non–Crystalline Solids, 35 & 36, pp. 291, 1980.

R.G. Wolfson et al., Ion–Implanted Thin–Film Solar Cells on Sheet Silicon, IEEE Photovoltaic Specialists Conference, 1981, pp. 595–597.

D.E. Carlson, Recent Developments in Amorphous Silicon Solar Cells, Solar Energy Materials, 3, 1980, pp. 503–518.

D.E. Carlson, Amorphous Thin Films for Terrestrial Solar Cells, Journal of Vacuum Science & echnology, vol. 20, No. 3, Mar. 1982, pp. 290–295.

D.E. Carlson et al., Amorphous Silicon Solar Cells, Quarterly Report No. 4, for the period Jul. 1, 1981 to Sep. 30, 1981, Nov. 1981, pp. 1–33.

A. Yusa et al., Ultrahigh Purification of Silane for Semiconductor Silicon, J. Electrochem. Soc.: Solid–State Science and Technology, Dec. 1975, pp. 1700–1705.

S.J. Solomon, Silicon from Silane Through Plasma Deposition, Conference Record of the 15th IEEE Photovoltaic Specialists Conference, 1981, pp. 569–571.

P.E. Vanier et al., New Features of the Temperature Dependence of Photoconductivity in Plasma–Deposited Hydrogenated Amorphous Silicon Alloys, J.Appl. Phys. vol. 52, No. 8, Aug. 1981, pp. 5235–5242.

J.R. Davis et al., Silicon Solar Cells from Transistor Metal Doped Czochralski and Web Crystals, Conference Record of the 12th IEEE Photovoltaic Specialists Conference, 1976, pp. 106–111.

M. Wolf et al., Silicon Fluoride Transport: Summary of Current Results and Interim Assessment, Conference Record of the 12th IEEE Photovoltaic Specialists Conference, 1976, pp. 137–145.

W.E. Spear, Doped Amorphous Semiconductors, Advances in Physics, vol. 26, No. 6, Nov. 1977, pp. 811–845.

P. Viktorovitch et al., Determination of the Electronic Density of States in Hydrogenated Amorphous Silicon ($\alpha$–SiH) from Schottky Diode Capacitance–Voltage and Conductance–Voltage Measurements, Journal of Non–Crystalline Solids, 35 & 36, 1980, pp. 569–574.

C.H. Hyun et al., DLTS Response Due to Localized States in Hydrogenated Amorphous Silicon, Journal of Non–Crystalline Solids, 46, 1981, pp. 221–234.

W.E. Spear et al., Electronic Properties of Substitutionally Doped Amorphous SI, Philosophical Magazine, vol. 33, No. 6, 1976, pp. 935–949.

J.R. McCormick, Preparation and Characterization of Low Cost Silicon Substrates for Epitaxial Solar Cell Applications, Proceedings of the 14th IEEE Photovoltaic Specialists Conference, 1980, pp. 298–302.

J.M. McBain, Sorption by Chabasite, Other Zeolites and Permeable Crystals, The Sorption of Gases and Vapours by Solids, Rutledge & Sons, Ltd., London, 1932, pp. 167–176.

A. Yusa et al., Ultrahigh Purification of Silane for Semiconductor Silicon, J. Electrochem. Soc.: Solid–State Science and Technology, vol. 122, No. 12, Nov. 1975, pp. 1700–1705.

T. Takahashi et al., Changes in the Sieving Action and Thermal Stability of Zeolite A Produced by Ion–Exchange, Faraday Transactions I, Journal of Physical Chemistry pt. 1, 1975, pp. 97–105.

T. Ohgushi et al., The Molecular Sieving Action of Ion–Exchanged Zeolites A, Bulletin of the Chemical Society of Japan, vol. 51, No. 2, 1978, pp. 419–421.

D.E. Carlson et al. Amorphous Silicon Solar Cells, Applied Physics Letters, vol. 28, No. 11, Jun. 1, 1976, pp. 671–673.

D.L. Staebler et al., Reversible Conductivity Changes in Discharge–Produced Amorphous, Applied Physics Letters, vol. 31, No. 4, Aug. 15, 1977, pp. 292–294.

C.R. Wronski, The Light Induced Changes in A–Si:H Materails and Solar Cells—Wherewe Are Now, MRS (to be published), 1997, 11 pages.

Kamei et al., (to be published) (Date Unknown).

T. Kamei et al., Deposition and Extensive Light Soaking of Highly Pure Hydrogenated Amorphous Silicon, Applied Physics Letters, vol. 68, No. 17, Apr. 22, 1996, pp. 2380–2382.

M. Stutzmann et al., Light–Induced Metastable Defects in Hydrogenated Amorphous Silicon: A Systematic Study, Phyusical Review B, The American Physical Society, vol. 32, No. 1, Jul. 1, 1985, pp. 23–47.

C.C. Tsai et al., Amorphous Si Prepared in a UHV Plasma Deposition System, Journal of Non–Crystalline Solids, vols. 59 & 60, 1983, pp. 731–734.

C.C. Tsai et al., The Staebler–Wronskieffect in Undoped $\alpha$–Si:H: Its Intrinsic Nature and the Influence of Imprurities, American Institute of Physics, 1984, pp. 242–249.

B.R. Weinberger et al., AM–1 Short Circuit Currents in Small Area Pin a–$SiH_x$ Solar Cells, 16th IEEE Photovolatic Specialists Conference, 1982, pp. 1316–1320.

R. Plattner et al., Influence of Impurities and Doping Residues on the Stability Behavior of a–Si:H and a–SiGE:H–PIN Cells, 18th IEEE Photovoltaic Specialists Conference, 1985, pp. 1598–1603.

C.R. Wronski et al., Recombination Centers in Phosphorous Doped Hydrogenated Amorphous Silicon, Solid State Communications, vol. 44, No. 10, 1982, pp. 1423–1426.

G. Lucovsky, Expert Report, Semiconductor Energy Lab. Vs. Samsung, 1997.

C.W. Magee, Expert Report, Semiconductor Energy Lab. Vs. Samsung, 1997.

C.C. Tsai, M.J. Thompson, and H.C. Tuan, Mat. Res. Symp. Proc. 33, 297, 1984.

C.W. Magee, J.C. Bean, G. Foti and J.M. Poate, Thin Solid Films 81, 1, 1981.

J.C. Bean, J.M. Poate, Appl. Phys. Letters, 36, 59, 1980.

G. Fotie, J.C. Bean, J.M. Poate and C.W. Magee, Appl. Phys. Letters, 36, 840, 1980.

T. Yamamoto, S. Yamamoto, S. Tomita, K. Okuno, F. Soeda, Y. Murata and A. Isitani, SIMS X, ed. by A. Benninghoven, B. Hagendorf and H.W. Werner, John Wiley & Sons, Chichester, 1997.

S. Smith, Expert Report, Semiconductor Energy Lab. Vs. Samsung, 1997.

Tsai et al., "Glow Discharge a–Si:H Produced in a UHV System", *Tenth International Conference on Amorphous and Liquid Semiconductors*, Tokyo, Aug. 22–26, 1983, p. 311.

Affidavit of Chuang Chuang Tsai dated Jun. 1, 1995.

Matsumura, "(Invited) Amorphous Silicon Transistors and Integrated Circuits", *Japanese Journal of Applied Physics*, vol. 22 (1983) Supplement 22–1, pp. 487–491.

LeComber et al., "Amorphous–Silicon Field–Effect Device and Possible Application", *Electronics Letters*, Mar. 15th, 1979, vol. 15, No. 6, pp. 179–181.

Roy, et al., "Growth Structure of Cast Silicon and Related Photovoltaic Properties of Solar Cells", *The Conference Record of the Fourteenth IEEE Photovoltaic Specialists Conference*, 1980, pp. 897–901.

Kamins, et al., "MOSFETs in Laser–Recrystallized Poly–Silicon on Quartz", 1980, IEEE.

Delahoy et al., "Impurity Effects in a–Si:H Solar Cells", *Conference Record, 15th IEEE Photovoltaic Specialists Conference*, 1981, pp. 704–712.

Ohrishi et al., The annual meeting of applied physics in Japan (1980) 3p–T–12.

Sakai et al., The 28th annual meeting of Japan Society of Appl. Phys. (Spring 1981) 29p–T–2.

Ishiwata et al., The 28th annual meeting of Japan, Society of Appl. Phys. (Spring 1981) 1a–S–9.

Amorphous Semiconductor, Technologies and Devices, 1982, Editor Y. Hamakawa, et al., p 194– North Holland Publishing Corporation.

Palz, W. et al., "Photovoltaic Solar Energy Conference", Proceedings of International Conference, held at Athens, Greece, Oct. 17–21, 1983, D. Reidel Publishing Company, 6 pages submitted including letter to publisher dated Mar. 10, 1999.

M. Möller et al, *Conference Record, 16th IEEE Photovoltaic Specialists Conf.* (Sep. 1982), pp 1376–1380.

"Investigation of the Hydrogen and Impurity Contents of Amorphous Silicon by Secondary Ion Mass Spectrometry", *Solar Cells*, vol. 2, pp. 365–376 (1980).

C.C. Tsai et al, *J. Non–Crystalline Solids*, vols. 59–60 (Dec. 1983), Part II, pp 731–734.

PHOTOELECTRIC CONVERSION DEVICE

Matter enclosed in heavy brackets [ ] appears in the original patent but forms no part of this reissue specification; matter printed in italics indicates the additions made by reissue.

*CROSS REFERENCE TO RELATED APPLICATION*

*This application is a continuation of application Ser. No. 08/408,499 filed Mar. 22, 1995, now abandoned, which is reissue of application Ser. No. 06/564,213 filed Dec. 22, 1983, now U.S. Pat. No. 4,581,476, which is a continuation-in-in-part of Ser. No. 06/525,459 filed Aug. 22, 1983, now U.S. Pat. No. 4,591,892.*

BACKGROUND OF THE INVENTION

1. Field of the Invention

The present invention relates to a photoelectric conversion device which has a non-single-crystal semiconductor laminate member having formed therein at least one PIN junction, and a method for the manufacture of such a photoelectric conversion device.

2. Description of the Prior Art

A photoelectric conversion device of the type including a non-single-crystal semiconductor laminate member having formed therein at least one PIN junction usually has the non-single-crystal semiconductor laminate member formed on a substrate having a conductive surface and a conductive layer formed on the non-single-crystal semiconductor laminate member. The non-single-crystal semiconductor laminate member has at least a first non-single-crystal semiconductor layer of a P or N first conductivity type, an I type second non-single-crystal semiconductor layer formed on the first non-single-crystal semiconductor layer and a third non-single-crystal semiconductor layer formed on the second non-single-crystal semiconductor layer and having a second conductivity type opposite from the first conductivity type. The first, second and third non-single-crystal semiconductor layers form one PIN junction.

In this case, for example, the substrate has such a structure that a light-transparent conductive layer is formed as a first conductive layer on a light-transparent insulating substrate body. The first and third non-single-crystal semiconductor layers of the non-single-crystal semiconductor laminate member are P- and N-type, respectively. Further, the conductive layer on the non-single-crystal semiconductor laminate member is formed as a second conductive layer on the N-type third non-single-crystal semiconductor layer.

With the photoelectric conversion device of such a structure as described above, when light is incident on the side of the light-transparent substrate towards the non-single-crystal semiconductor laminate member, electron-hole pairs are created by the light in the I-type second non-single-crystal semiconductor layer. Holes of the electron-hole pairs thus created pass through the P-type first non-single-crystal semiconductor layer to reach the first conductive layer, and electrons flow through the N-type third non-single-crystal semiconductor layer into the second conductive layer. Therefore, photocurrent is supplied to a load which is connected between the first and second conductive layers, thus providing a photoelectric conversion function.

In conventional photoelectric conversion devices of the type described above, however, since the I-type second non-single-crystal semiconductor layer is formed to contain oxygen with a concentration above $10^{20}$ atoms/cm$^3$, and/or carbon with a concentration above $10^{20}$ atoms/cm$^3$, and/or phosphorus with a concentration as high as above $5\times10^{17}$ atoms/cm$^3$, the I-type non-single-crystal semiconductor layer inevitably contains impurities imparting N conductivity type, with far lower concentrations than in the P-type first non-single-crystal semiconductor layer and the N-type third non-single-crystal semiconductor layer.

In addition, the impurity concentration has such a distribution that it undergoes substantially no variations in the thickness direction of the layer.

On account of this, in the case where the second non-single-crystal semiconductor layer is formed thick with a view to creating therein a large quantity of electron-hole pairs in response to the incidence of light, a depletion layer, which spreads into the second non-single-crystal semiconductor layer from the PI junction defined between the P-type first and the I-type second non-single-crystal semiconductor layers, and a depletion layer, which spreads into the second non-single-crystal semiconductor layer from the NI junction defined between the N-type third and the I-type second non-single-crystal semiconductor layers, are not linked together. In consequence, the second non-single-crystal semiconductor layer has, over a relatively wide range thickwise thereof at the central region in that direction, a region in which the bottom of the conduction band and the top of the valence band of its energy band are not inclined in the directions necessary for the holes and electrons to drift towards the first and third non-single-crystal semiconductor layers, respectively. Therefore, the holes and electrons of the electron-hole pairs created by the incident light in the second non-single-crystal semiconductor layer, in particular, the electrons and holes generated in the central region of the second layer in its thickness direction, are not effectively directed to the first and third non-single-crystal semiconductor layers, respectively.

Accordingly, the prior art photoelectric conversion devices of the above described structure have the defect that even if the second non-single-crystal semiconductor layer is formed thick for creating a large quantity of electron-hole pairs in response to incident light, a high photoelectric conversion efficiency cannot be obtained.

Further, even if the I-type second non-single-crystal semiconductor layer is thick enough to permit the depletion layer extending into the second non-single-crystal semiconductor layer from the PI junction between the P-type first non-single-crystal semiconductor layer on the side on which light is incident and the I-type second non-single-crystal semiconductor layer formed on the first semiconductor layer and the depletion layer extending into the second non-single-crystal semiconductor layer from the NI junction between the N-type third non-single-crystal semiconductor layer on the side opposite from the side of the incidence of light and the I-type second non-single-crystal semiconductor layer to be linked together, the expansion of the former depletion layer diminishes with the lapse of time for light irradiation by virtue of a known light irradiation effect commonly referred to as the Staebler-Wronski effect, because the I-type non-single-crystal semiconductor layer forming the PI junction contains impurities which impart N conductivity type as mentioned previously. Finally, the abovesaid depletion layers are disconnected from each other. In consequence, there is formed in the central region of the second non-single-crystal semiconductor layer in the thickness direction thereof a region in which the bottom of the conduction band and the top of the valence band of the energy band are not inclined in the directions in which the holes and electrons of the electron-hole pairs created by the incidence of light are drifted towards the first and third non-single-crystal semiconductor layers, respectively.

Accordingly, the conventional photoelectric conversion devices of the abovesaid construction have the defect that the photoelectric conversion efficiency is impaired by the long-term use of the devices.

SUMMARY OF THE INVENTION

It is therefore an object of the present invention to provide a novel photoelectric conversion device which is able to achieve a far higher photoelectric conversion efficiency than that obtainable with the conventional devices described above.

Another object of the present invention is to provide a novel photoelectric conversion device the photoelectric conversion efficiency of which is hardly or only slightly lowered by the Staebler-Wronski effect even if it is used for a long period of time.

Yet another object of the present invention is to provide a novel method which permits easy manufacture of the photoelectric conversion device having the abovesaid excellent features.

In accordance with an aspect of the present invention, the first (or third) non-single-crystal semiconductor layer of the non-single-crystal laminate member is a layer on the side on which light is incident and is of P conductivity type, and the I-type second non-single-crystal semiconductor layer has introduced therein an impurity for imparting thereto P type conductivity, which is distributed so that the impurity concentration continuously decreases towards the third (or first) non-single-crystal semiconductor layer in the thickness direction of the I-type layer.

In this case, for example, the substrate is light-transparent and, accordingly, the first non-single-crystal semiconductor layer is disposed on the side where light is incident. The first and third non-single-crystal semiconductor layers are P- and N-type, respectively, and the I-type second non-single-crystal semiconductor layer has introduced therein an impurity for imparting thereto P-type conductivity, such as boron, so that its concentration in the region adjacent the first non-single-crystal semiconductor layer is higher than the concentration in the region adjacent the third non-single-crystal semiconductor layer.

On account of this, even if the I-type second non-single-crystal semiconductor layer is formed relatively thick for creating therein a large quantity of electron-hole pairs in response to the incidence of light, the depletion layer extending into the second non-single-crystal semiconductor layer from the PI junction between the first and second non-single-crystal semiconductor layers and the depletion layer extending into the second non-single-crystal layer from the NI junction between the third and second non-single-crystal semiconductor layers are joined together. Accordingly, the holes and electrons which are produced in the central region of the second non-single-crystal semiconductor layer in its thickness direction are also effectively drifted towards the first and third non-single-crystal semiconductor layers, respectively.

Moreover, even if the I-type second non-single-crystal semiconductor layer contains impurities which impart thereto N-type conductivity, because it is formed to contain oxygen and/or carbon and/or phosphorus in large quantities as described previously, boron, which imparts P-type conductivity and is introduced into the second non-single-crystal semiconductor layer, combines with oxygen, and/or carbon, and/or phosphorus. Besides, the P-type impurity introduced into the second non-single-crystal semiconductor layer has a high concentration in the region thereof adjacent the P-type first non-single-crystal semiconductor layer, that is, on the side of the PI junction. Therefore, the expansion of the depletion layer spreading into the second non-single-crystal semiconductor layer from the PI junction between the first and second non-single-crystal semiconductor layers is scarcely or only slightly diminished by the light irradiation effect (the Staeabler-Wronski effect).

Accordingly, the photoelectric conversion device of the present invention retains a high photoelectric conversion efficiency, even if used for a long period of time.

In accordance with another aspect of the present invention, the second non-single-crystal semiconductor layer, which has introduced thereinto an impurity which imparts P-type conductivity, with such a distribution that its concentration continuously decreases towards the N-type third (or first) non-single-crystal semiconductor layer in the thickness direction of the second layer, can easily be formed, through a CVD (Chemical Vapor Deposition) method using a semiconductor material gas and an impurity material gas for imparting P-type conductivity, merely by continuously decreasing (or increasing) the concentration of the depart material gas relative to the semiconductor material gas with the lapse of time.

Accordingly, the manufacturing method of the present invention allows ease in the fabrication of the photoelectric conversion device of the present invention which possesses the aforementioned advantages.

Other objects, features and advantages of the present invention will become more fully apparent from the detailed description taken in conjunction with the accompanying drawings.

DESCRIPTION OF THE PREFERRED EMBODIMENTS

A description will be given of, with reference to FIGS. 1 and 2, of a first embodiment of the photoelectric conversion device of the present invention, along with the manufacturing method of the present invention.

The manufacture of the photoelectric conversion device starts with the preparation of an insulating, light-transparent substrate 1 as of glass (FIG. 1).

Figure 1A:
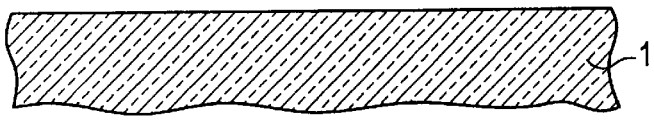
FIGS. 1A to D are sectional views schematically illustrating a sequence of steps involved in the manufacture of a photoelectric conversion device in accordance with an embodiment of the present invention.
Figure 1B:
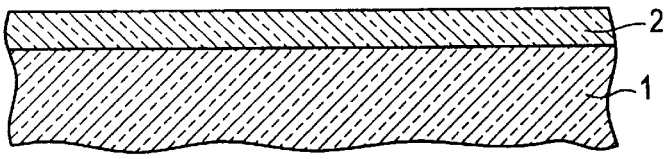

A light-transparent conductive layer 2 is formed on the substrate 1 (FIG. 1B).

The conductive layer 2 is formed of, for example, a tin oxide, or a light-transparent conductive material consisting principally of a tin oxide. The conductive layer 2 is formed by, for example, a known vacuum evaporation method to a thickness of, for instance, 0.1 to 0.2 $\mu$m.

Figure 1C:
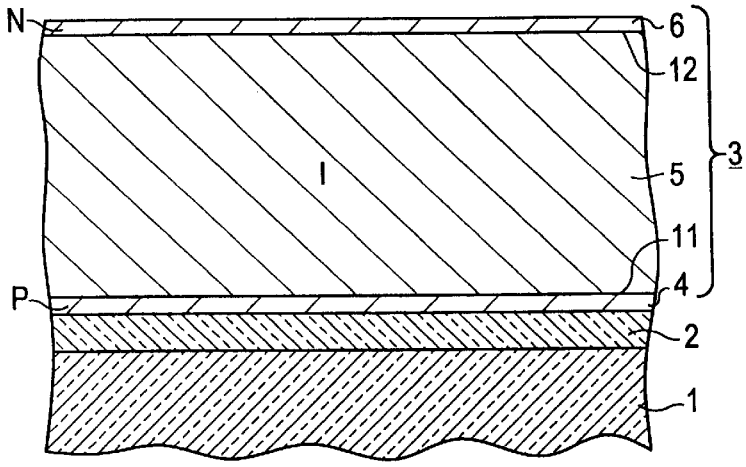

Next, a non-single-crystal semiconductor laminate member 3 is formed on the conductive layer 2 (FIG. 1C).

The non-single-crystal semiconductor laminate member 3 has such a structure that a P-type non-single-crystal semiconductor layer 4, an I-type non-single-crystal semiconductor layer 5, and an N-type non-single-crystal semiconductor layer 6 are sequentially formed in this order. These non-single-crystal semiconductor layers 4, 5, and 6 form a PIN junction.

The non-single-crystal semiconductor layer 4 of the non-single-crystal semiconductor laminate member 3 is formed of, for example, Si, $Si_xC_{1-x}$ (where 0<x<1, for instance, x=0.8) or Ge in an amorphous, semiamorphous, or microcrystalline form. The non-single-crystal semiconductor layer 4 is, for example, 100 angstroms thick. Moreover, the energy band gap of layer 4 is preferably larger than that of layer 5.

The non-single-crystal semiconductor layer 4 is formed by a CVD method which employs a semiconductor material gas composed of a hydride or halide of a semiconductor, such as Si, $Si_xGe_{1-x}$ (where 0<x1) or Ge, and an impurity material gas composed of a hydride or halide of a P-type impurity, for instance, diborane ($B_2H_6$). The CVD method may or may not employ a glow discharge (plasma), or light. In this case, the non-single-crystal semiconductor layer 4 has a P-type impurity introduced therein (boron) in a concentration above about $1\times10^{18}$ and as high as $1\times10^{19}$ to $6\times10^{20}$ atoms/cm$^3$, as shown in FIG. 2B.

The non-single-crystal semiconductor layer 5 is formed of, for instance, amorphous or semi-amorphous silicon, and has a thickness of, for example, 3 to 0.8 $\mu$m, in particular, 0.5 $\mu$m.

The non-single-crystal semiconductor layer 5 is formed by a CVD method which uses a semiconductor raw material gas composed of a hydride or halide of silicon, for example, $Si_nH_{2n+2}$ (where n is greater than or equal to 1), or $SiF_m$ (where m is greater than or equal to 2), and a deposit material gas composed of a hydride or halide of a P-type impurity, for instance, diborane ($B_2H_6$). The CVD method may or may not employ a glow discharge (plasma), or light. In this case, by decreasing the concentration of the deposit material gas relative to the concentration of the semiconductor material gas within a range of less than 5 ppm with the lapse of time, the non-single-crystal semiconductor layer 5 is formed having introduced thereinto a P-type impurity (boron) the concentration of which linearly and continuously decreases in the thickness direction of the layer towards the non-single-crystal semiconductor layer 6 as shown in FIG. 2B. The concentration of the P-type impurity in the non-single-crystal semiconductor layer 5 is high on the side of the non-single-crystal semiconductor layer 4 as compared with the impurity concentration on the side of the non-single-crystal semiconductor layer 6. The ratio of the impurity concentration in the layer 5 at one end thereof adjacent the layer 6 to the concentration at the other end adjacent the layer 4 is 1/10 to 1/100, preferably, 1/20 to 1/40. In practice, the P-type impurity (boron) has a concentration of $2\times10^{15}$ to $2\times10^{17}$ atoms/cm$^3$ at the end of the layer 5 adjacent the layer 4 and a concentration below $1\times10^{15}$ atoms/cm$^3$ at the end of the layer 5 adjacent the layer 6.

The non-single-crystal semiconductor layer 5 is formed by the abovesaid CVD method. In this case, the semiconductor raw material gas is one that is obtained by passing a semiconductor raw material gas through a molecular sieve or zeolite which adsorbs oxygen, and/or carbon and/or phosphorus. Accordingly, the non-single-crystal semiconductor layer 5 is formed to contain oxygen at a concentration less than $5\times10^{19}$ and as low as $5\times10^{18}$ atoms/cm$^3$, and/or carbon at a concentration less than $4\times10^{18}$ and as low as $4\times10^{15}$ atoms/cm$^3$, and/or phosphorus at a concentration at least as low as $5\times10^{15}$ atoms/cm$^3$.

The non-single-crystal semiconductor layer 6 is formed of, for instance, microcrystalline silicon, and has a thickness of, for example, 100 to 300 angstroms. Moreover, the energy band gap of layer 6 is preferably larger than that of layer 5.

The non-single-crystal semiconductor layer 6 is formed by a CVD method which employs a semiconductor raw material gas composed of a hydride or halide of silicon, for example, $Si_nH_{2n+2}$ (where n is greater than or equal to 1) or $SiF_m$ (where m is greater than or equal to 2), and an impurity material gas composed of a hydride or halide of an N-type impurity, for instance, phosphine ($PH_3$). The CVD method may or may not employ a glow discharge (plasma) or light. In this case, the non-single-crystal semiconductor layer 6 has an N-type impurity (phosphorus) introduced thereinto with a concentration of $1\times10^{19}$ to $6\times10^{20}$ atoms/cm$^3$, as shown in FIG. 2.

Figure 1D:
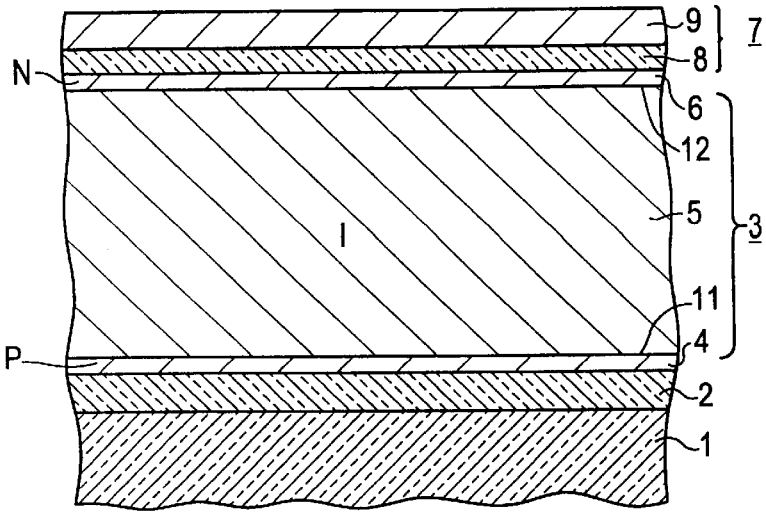

Next, a conductive layer 7 is formed on the non-single-crystal semiconductor laminate member 3 made up of the non-single-crystal semiconductor layers 4, 5, and 6, that is, on the non-single-crystal semiconductor layer 6 (FIG. 1D). Moreover, the energy band gap of layer 6 is, preferably larger than that of layer 5.

The conductive layer 7 has such a structure that a light-transparent conductive layer 8 formed of, for example, a tin oxide or a light-transparent conductive material consisting principally of tin oxide, and a reflective conductive layer 9 formed of a metal, such as aluminum, silver, or the like, are formed in this order. In this case, the conductive layer 8 is formed to a thickness of 900 to 1300 angstroms by means of, for example, vacuum evaporation, and the conductive layer 9 is also formed by vacuum evaporation.

Figure 2A:
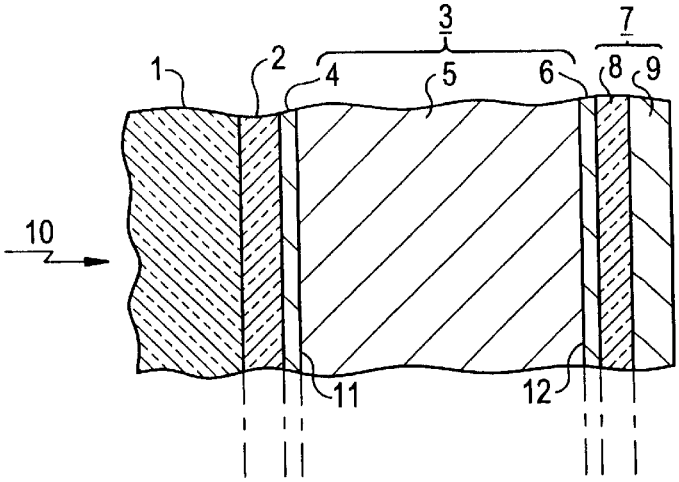
FIG. 2A is a sectional view schematically illustrating a first embodiment of the photoelectric conversion device by the manufacturing method shown in FIG. 1.
Figure 2B:
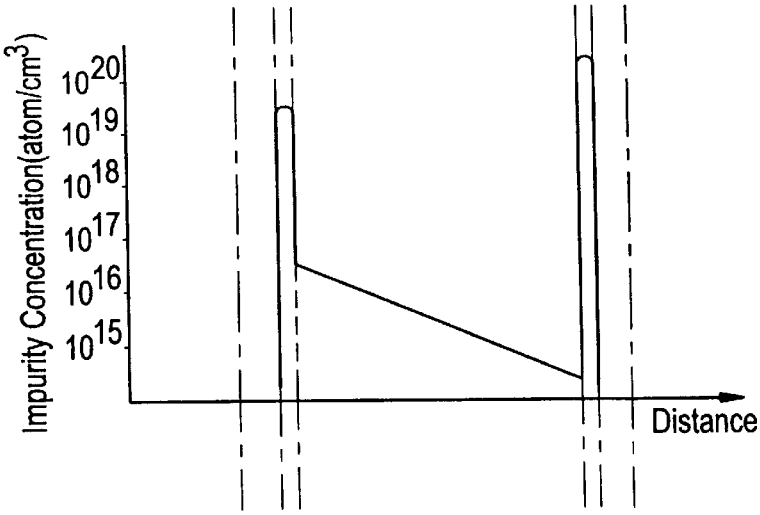
FIG. 2B is a graph showing the concentration distributions of impurities introduced into first, second, and third non-single-crystal semiconductor layers of the photoelectric conversion device depicted in FIG. 2A.

In the manner described above, the first embodiment of the photoelectric conversion device of the present invention shown in FIG. 2A is manufactured.

With the photoelectric conversion device shown in FIG. 2A, when light 10 is incident on the side of the substate 1 towards the non-single-crystal semiconductor laminate member 3, electron-hole pairs are created in the I-type non-single-crystal semiconductor layer 5 in response to the light 10. The holes of the electron-hole pairs thus produced flow through the P-type non-single-crystal semiconductor layer 4 into the light-transparent conductive layer 2, and the electrons flow through the N-type non-single-crystal semiconductor layer 6 into the conductive layer 7. Therefore, photocurrent is supplied to a load which is connected between the conductive layers 2 and 7, thus providing the photoelectric conversion function.

In this case, the I-type non-single-crystal semiconductor layer 5 has a P-type impurity (boron) introduced thereinto which is distributed so that the impurity concentration continuously decreases towards the non-single-crystal semiconductor layer 6 in the thickness direction of the layer 5, as shown in FIG. 2B. On account of this, even if the I-type non-single-crystal semiconductor layer 5 is formed thick for generating therein a large quantity of electron-hole pairs in response to the incident of light, a depletion layer (not shown) which extends into the non-single-crystal semiconductor layer 5 from the PI junction 11 between the P-type non-single-crystal semiconductor layer 4 and the I-type non-single-crystal semiconductor layer 5 and a depletion (not shown) layer which extends into the non-single-crystal semiconductor layer 5 from the NI junction 12 between the N type non-single-crystal semiconductor layer 6 and the non-single-crystal semiconductor layer 5 are joined together. Therefore, the I-type non-single-crystal semiconductor layer 5, as viewed from the bottom of the conduction band and the top of the valence bands of its energy band, has a gradient that effectively causes holes and electrons to drift towards the non-single-crystal semiconductor layers 4 and 6, respectively.

Accordingly, the photoelectric conversion device of the present invention, shown in FIG. 2A, achieves a higher photoelectric conversion efficiency than do the conventional photoelectric conversion devices.

Figure 3:
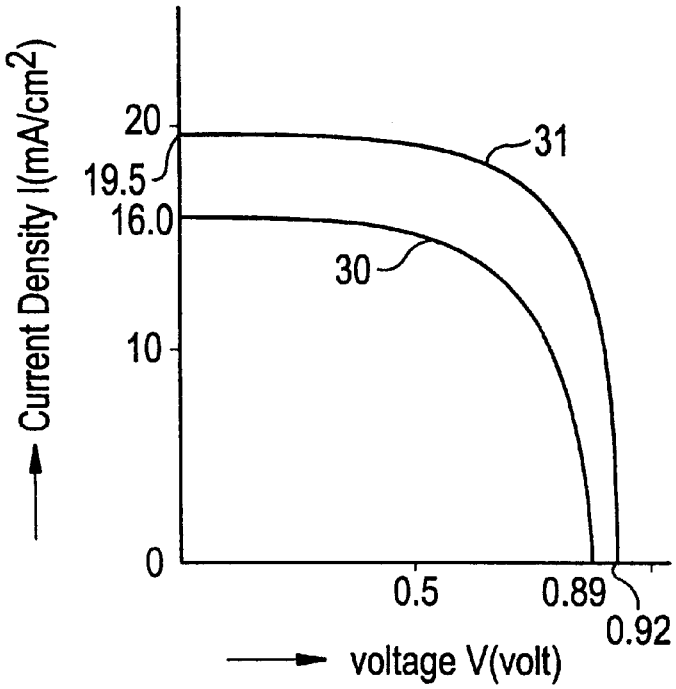
FIG. 3 is a graph showing the voltage V (volt)-current density I ($mA/cm^2$) characteristic of the photoelectric conversion device of FIG. 2, in comparison with the characteristic of a conventional photoelectric conversion device.

A photoelectric conversion device corresponding to the conventional one and which is identical in construction with the photoelectric conversion device of the present invention shown in FIG. 2A, except that the concentration of the N-type impurity in the I-type non-single-crystal semiconductor layer 5 is about $10^{16}$ atoms/cm$^3$, which is far lower than the impurity concentrations in the P-type and I-type non-single-crystal semiconductor layers 4 and 6 because the I-type non-single-crystal semiconductor layer 5 is formed to contain oxygen, and/or carbon, and/or phosphorus in large quantities, as referred to previously provided a voltage V (volt)-current density I (mA/cm$^2$) characteristic as indicated by curve 30 in FIG. 3. Accordingly, the open-circuit voltage was 0.89 V, the short-circuit current density I 16.0 mA/cm$^2$, the fill factor was 61%, and the photoelectric conversion efficiency about 8.7%. In contrast thereto, the photoelectric conversion device of the present invention shown in FIG. 2A, provided the voltage V -current density I characteristic as indicated by curve 31 in FIG. 3. Accordingly, the open-circuit voltage V was 0.92 V, which is higher than was obtained with the abovesaid device corresponding to the prior art device; the current density I was 19.5 mA/cm$^2$; the fill factor was 68%; and the photoelectric conversion efficiency was about 12.2%. Incidentally, these results were obtained under the conditions wherein the photoelectric conversion devices, each having a non-single-crystal semiconductor laminate member 3 of 1.05 cm$^2$ area, were exposed to irradiation by light with an intensity of AM1 (100 mW/cm$^2$).

In the case of the photoelectric conversion device of the present invention shown in FIG. 2A, since the I-type non-single-crystal semiconductor layer 5 has boron introduced thereinto as a P-type impurity the boron combines with the oxygen and/or carbon and/or phosphorus contained in the non-single-crystal semiconductor layer 5. In addition, the concentration of the P-type impurity (boron) is high on the side of the PI junction 11, that is, on the side of the P-type non-single-crystal semiconductor layer 4. Accordingly, the expansion of the depletion layer extending into the I-type non-single-crystal semiconductor layer 5 from the PI junction 11 between the P-type non-single-crystal semiconductor layer 4 and the I-type non-single-crystal semiconductor layer 5 is hardly or only slightly diminished by the light irradiation effect (the Staebler-Wronski effect).

For this reason, according to the photoelectric conversion device of the present invention, the aforesaid high photoelectric conversion efficiency is hardly impaired by long-term use.

Figure 4:
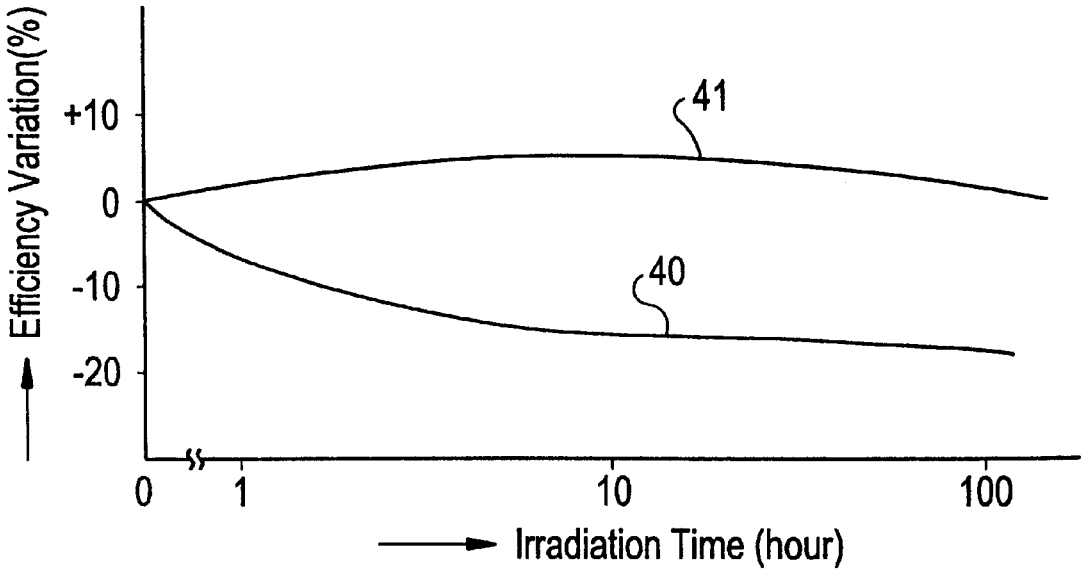
FIG. 4 is a graph showing variations (%) in the photoelectric conversion efficiency of the photoelectric conversion device of the present invention, shown in FIG. 2, in comparison with a conventional photoelectric converison device.

In addition, the aforesaid photoelectric conversion device corresponding to the prior art one which provided the voltage V-current density I characteristeristic indicated by the curve 30 in FIG. 3, exhibited variations (%) in the photoelectric conversion efficiency relative to the light irradiation time T (hr) as indicated by curve 40 in FIG. 4. In contrast thereto, in the case of the photoelectric conversion device of the present invention, the photoelectric conversion efficiency varied with the light irradiation time T as indicated by curve 41 in FIG. 4. That is, the photoelectric conversion efficiency slightly increased in an early stage and, thereafter, it decreased only very slightly with time. These results were also obtained under the same conditions mentioned previously in connection with FIG. 3.

As described above, the first embodiment of the photoelectric conversion device of the present invention possesses the advantage that it provides a higher photoelectric conversion efficiency than do the conventional photoelectric conversion devices, even when used for a long period of time.

Further, the manufacturing method of the present invention shown in FIG. 1 employs a series of simple steps such as forming the conductive layer 2 on the substrate 1, forming the non-single-crystal semiconductor layers 4, 5, and 6 on the conductive layer 2 through the CVD method to provide the non-single-crystal semiconductor laminate member 3, and forming conductor layer 7 on the non-single-crystal semiconductor laminate member 3. The I-type non-single-crystal semiconductor layer 5 is formed by a CVD method using a semiconductor raw material gas and a P-type deposit (boron) gas and, in this case, simply by continuously changing the concentration of the deposit material gas relative to the concentration of the semiconductor raw material gas as a function of time, the P-type impurity is introduced into the layer 5 with such a concentration distribution that its concentration continuously decreases towards the non-single-crystal semiconductor layer 6 in the thickness direction of the layer 5.

Accordingly, the manufacturing method of the present invention allows ease in the fabrication of the photoelectric conversion device of the present invention which has the aforementioned advantages.

Figure 2C:
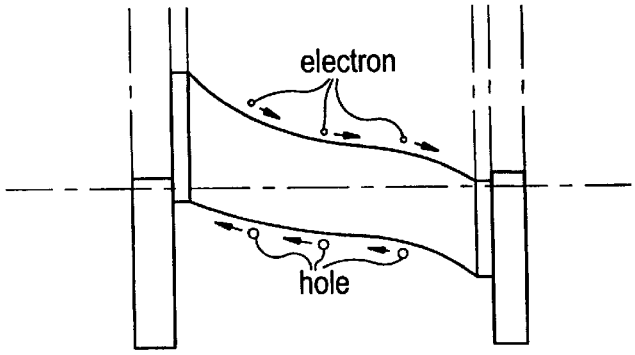
FIG. 2C is a graph showing the energy band of the photoelectric conversion device shown in FIG. 2A.

Incidentally, the first embodiment illustrated in FIG. 2 shows the case in which the impurity contained in the I-type non-single-crystal semiconductor layer 5 has such a concentration distribution as shown in FIG. 2B in which the concentration linearly and continuously drops towards the non-single-crystal semiconductor layer 6.

Figure 5A:
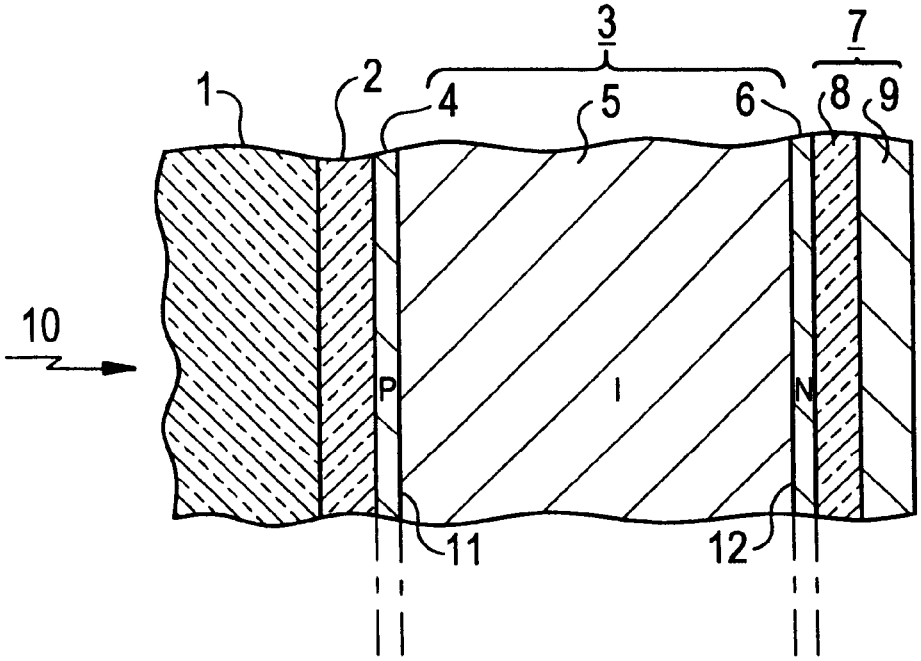
FIG. 5A is a sectional view schematically illustrating a second embodiment of the photoelectric conversion device of the present invention.
Figure 5B:
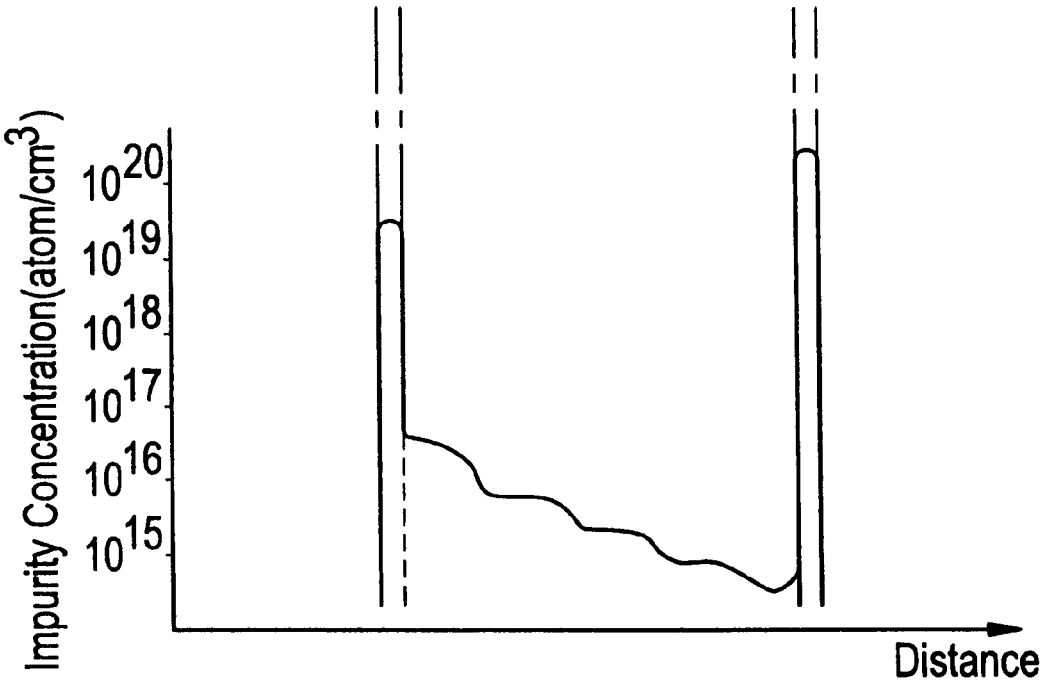
FIG. 5B is a graph showing concentration distributions of impurities introduced into first, second, and third non-single-crystal semiconductor layers of the second embodiment of the present invention.
Figure 6A:
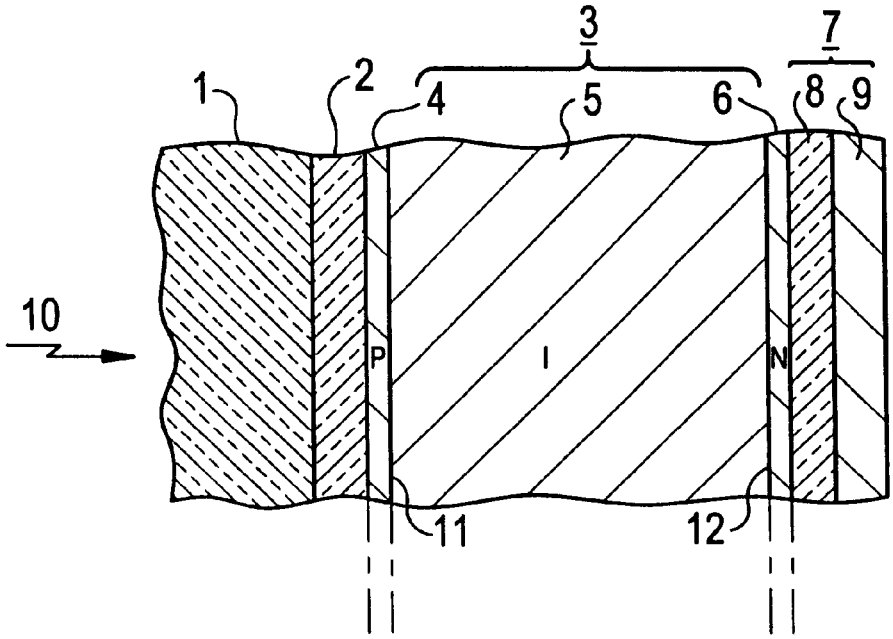
FIG. 6A is a sectional view sechematically illustrating a third embodiment of the photoelectric conversion device of the present invention.
Figure 6B:
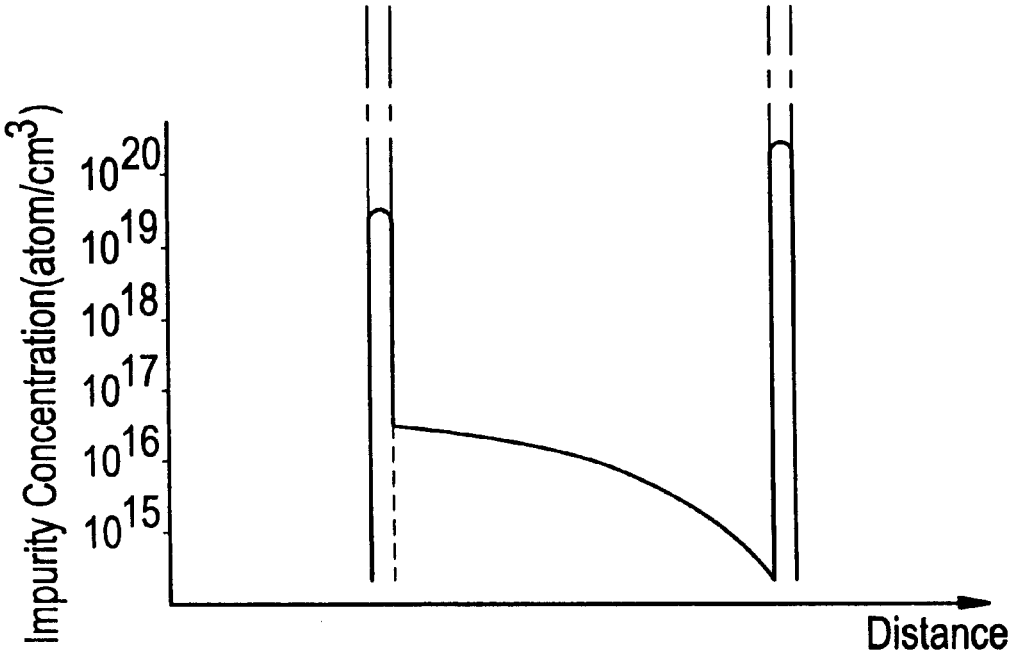
FIG. 6B is a graph showing the concentration distributions of impurities introduced into first, second, and third non-single-crystal semiconductor layers of the photoelectric conversion device shown in FIG. 6A.

As will be appreciated from the above, however, even if the impurity introduced in the I-type non-single-crystal semiconductor layer 5 has a concentration profile such that the impurity concentration drops stepwise and continuously towards the non-single-crystal semiconductor layer 6 as shown in FIG. 5 which illustrates a second embodiment of the present invention, and even if the impurity in the layer 5 has such a concentration distribution that the impurity concentration decreases non-linearly and continuously towards the layer 6 in a manner to obtain a concentration distribution such that the impurity concentration abruptly drops in the end portion of the layer 5 adjacent the layer 6 as shown in FIG. 6 which illustrates a third embodiment of the present invention, the photoelectric conversion device of the present invention produces the same excellent operation and effects as are obtainable with the photoelectric conversion device shown in FIG. 2.

Further, the foregoing description has been given of the case where light is incident on the photoelectric conversion device from the side of the substrate 1 and, accordingly, the non-single-crytal semiconductor layer 4 of the non-single-crystal semiconductor laminate member 3 on the side on which the light is incident is P-type.

But, also in case where the photoelectric conversion device is arranged to be exposed to light on the side opposite from the substrate 1, the non-single-crystal semiconductor layer 6 of the non-single-crystal semiconductor laminate member 3 on the side of the incidence of light is P-type, the non-single-crystal semiconductor layer 4 on the side of the substrate 1 is N-type and the non-single-crystal semiconductor layer 5 has introduced thereinto a P-type impurity (boron) which is distributed so that the impurity concentration continuously decreases towards the non single-crystal semiconductor layer 4 in the thickness direction of the layer 5, the same excellent operation and effects as described previously can be obtained, as will be understood from the foregoing description. In this case, however, the conductive layer 7 must be substituted with a light-transparent one. The substrate 1 and the conductive layer 2 need not be light-transparent.

While in the foregoing the non-single-crystal semiconductor laminate member 3 has one PIN junction, it is also possible to make the laminate member 3 have two or more PIN junctions and to form each of the two or more I-type non-single-crystal semiconductor layers so that the P-type impurity introduced therein may have the aforesaid concentration distribution.

It will be apparent that many modifications and variations may be effected without departing from the scope of the novel concepts of the present invention.

What is claimed is:

1. A photoelectric conversion device comprising:

a substrate having a conductive surface;

a non-single-crystal semiconductor laminate member formed on the substrate; and a conductive layer formed on the non-single-crystal semiconductor laminate member;

wherein the non-single-crystal semiconductor laminate member has a first non-single-crystal semiconductor layer of P-type conductivity, an I-type second non-single-crystal semiconductor layer formed on the first non-single-crystal semiconductor layer, and a third non-single-crystal semiconductor layer of N-type conductivity formed on the second non-single-crystal semiconductor layer, the first, second, and third non-single-crystal semiconductor layers forming a PIN junction;

wherein the first non-single-crystal semiconductor layer is disposed on the side on which light is incident;

wherein the second non-single-crystal semiconductor layer has introduced thereinto a P-type impurity which is distributed so that its concentration continuously decreases towards the third non-single-crystal semiconductor layer in the thickwise direction of the second layer; and wherein the second non-single-crystal semiconductor layer contains hydrogen or a halogen as a recombination center neutralizer and further contains oxygen at a concentration less than $5\times10^{19}$ atoms/cm$^3$.

2. A photoelectric conversion device comprising:

a substrate having a conductive surface;

a non-single semiconductor laminate member formed on the substrate; and a conductive layer formed on the non-single-crystal semiconductor laminate member;

wherein the non-single-crystal semiconductor laminate member has a first non-single-crystal semiconductor layer of N-type conductivity, an I-type second non-single-crystal semiconductor layer formed on the first non-single-crystal semiconductor layer, and a third non-single-crystal semiconductor layer of P-type conductivity formed on the second non-single-crystal semiconductor layer, the first, second, and third non-single-crystal semiconductor layers forming an NIP junction;

wherein the third non-single-crystal semiconductor layer is disposed on the side on which light is incident;

wherein [be] *the* second non-single-crystal semiconductor layer has introduced thereinto a P-type impurity which is distributed so that its concentration continuously decreases towards the first non-single-crystal semiconductor layer in the thickwise direction of the second layer; and wherein the second non-single-crystal semiconductor layer contains hydrogen or a halogen as a recombination center neutralizer and further contains oxygen at a concentration less than $5\times10^{19}$ atoms/cm$^3$.

3. A photoelectric conversion device comprising:

a substrate having a conductive surface;

a non-single-crystal semiconductor laminate member formed on the substrate; and a conductive layer formed on the non-single-crystal semiconductor laminate member;

wherein the non-single-crystal semiconductor laminate member has a first non-single-crystal semiconductor layer of P-type conductivity, an I-type second non-single-crystal semiconductor layer formed on the first non-single-crystal semiconductor layer, and a third non-single-crystal semiconductor layer of N-type conductivity formed on the second non-single-crystal semiconductor layer, the first, second, and third non-single-crystal semiconductor layers forming a PIN junction;

wherein the first non-single-crystal semiconductor layer is disposed on the side on which light is incident;

wherein the second non-single-crystal semiconductor layer has introduced thereinto a P-type impurity which is distributed so that its concentration continuously decreases towards the third non-single-crystal semiconductor layer in the thickwise direction of the second layer; and wherein the second non-single-crystal semiconductor layer contains hydrogen or a halogen as a recombination center neutralizer and further contains carbon at a concentration less than $4\times10^{18}$ atoms/cm$^3$.

4. A photoelectric conversion device comprising:

a substrate having a conductive surface;

a non-single-crystal semiconductor laminate member formed on the substrate; and a conductive layer formed on the non-single-crystal semiconductor laminate member;

wherein the non-single-crystal semiconductor laminate member has a first non-single-crystal semiconductor layer of N-type first conductivity, an I-type non-single-crystal semiconductor layer formed on the first non-single-crystal semiconductor layer, and a third non-single-crystal semiconductor layer of P-type conductivity formed on the second non-single-crystal semiconductor layer, the first, second, and third non-single-crystal semiconductor layers forming an NIP junction;

wherein the third non-single-crystal semiconductor layer is disposed on the side on which light is incident;

wherein the second non-single-crystal semiconductor layer has introduced thereinto a P-type impurity which is distributed so that its concentration continuously decreases towards the first non-single-crystal semiconductor layer in the thickwise direction of the second layer; and wherein the second non-single-crystal semiconductor layer contains hydrogen or a halogen as a recombination center neutralizer and further contains carbon at a concentration less than $4\times10^{18}$ atoms/cm$^3$.

5. A photoelectric conversion device comprising:

a substrate having a conductive surface;

a non-single-crystal semiconductor laminate member formed on the substrate; and a conductive layer formed on the non-single-crystal semiconductor laminate member;

wherein the non-single-crystal semiconductor laminate member has a first non-single-crystal semiconductor layer of P-type conductivity, an I-type second non-single-crystal semiconductor layer formed on the first non-single-crystal semiconductor layer, and a third non-single-crystal semiconductor layer of N-type conductivity formed on the second non-single-crystal semiconductor layer, the first, second, and third non-single-crystal semiconductor layers forming a PIN junction;

wherein the first non-single-crystal semiconductor layer is disposed on the side on which light is incident;

wherein the second non-single-crystal semiconductor layer has introduced thereinto a P-type impurity which is distributed so that its concentration continusouly decreases towards the third non-single-crystal semiconductor layer in the thickwise direction of the second layer; and wherein the second non-single-crystal semiconductor layer contains hydrogen or a halogen as a recombination center neutralizer and further contains phosphorus at a concentration less than $5\times10^{15}$ atoms/cm$^3$.

6. A photoelectric conversion device comprising:

a substrate having a conductive surface;

a non-single-crystal semiconductor laminate member formed on the substrate; and a conductive layer formed on the non-single-crystal semiconductor laminate member;

wherein the non-single-crystal semiconductor laminate member has a first non-single-crystal semiconductor layer of N-type first conductivity type, an I-type second non-single-crystal semiconductor layer formed on the first non-single-crystal semiconductor layer, and a third non-single-crystal semiconductor layer of P-type conductivity formed on the second non-single-crystal semiconductor layer, the first, second, and third non-single-crystal semiconductor layers forming an NIP junction;

wherein the third non-single-crystal semiconductor layer is disposed on the side on which light is incident;

wherein the second non-single-crystal semiconductor layer has introduced thereinto a P-type impurity which is distributed so that its concentration continuously decreases towards the first non-single-crystal semiconductor layer in the thickwise direction of the second layer; and wherein the second non-single-crystal semiconductor layer contains hydrogen or a halogen as a recombination center neutralizer and further contains phosphorous at a concentration less than $5\times10^{15}$ atoms/cm$^3$.

7. A photoelectric conversion device according to any one of claims 1 to 6, wherein the ratio of P-type impurity concentrations in the second non-single-crystal semiconductor layer at both ends thereof adjoining the first and third non-single-crystal semiconductor layers, respectively, is in the range of 1/10 to 1/100.

8. A photoelectric conversion device according to any one of claims 1, 3, or 5, wherein the substrate is light-transparent.

9. A photoelectric conversion device according to claim 8, wherein the P-type impurity introduced into the first non-single-crystal semiconductor layer is boron.

10. A photoelectric conversion device according to claim 8, wherein the concentration of the P-type impurity in the first non-single-crystal semiconductor layer is above $10^{18}$ atoms/cm$^3$, wherein the P-type impurity introduced into the second non-single-crystal semiconductor layer is boron and has a concentration in the range of $2\times10^{15}$ to $2\times10^{17}$ atoms/cm$^3$ at one end of the second layer adjoining the first non-single-crystal semiconductor layer, and wherein the ratio of the concentration of the P-type impurity in the second non-single-crystal semiconductor layer at the other end thereof adjoining the third non-single-crystal semiconductor to the P-type impurity concentration in the second layer at the said one end thereof is in the range of 1/10 to 1/100.

11. A photoelectric conversion device according to claim 10, wherein the first non-single-crystal semiconductor layer has a larger energy band gap than does the second non-single-crystal semiconductor layer.

12. A photoelectric conversion device according to claim 11, wherein the first non-single-crystal semiconductor layer is formed of $Si_xC_{1-x}$ [(] where $0<x<1$[)], and wherein the second non-single crystal semiconductor layer is formed of silicon.

13. A photoelectric conversion device according to any one of claims 1, 4, or 5, wherein the P-type impurity introduced into the third non-single-crystal semiconductor layer is boron.

14. A photoelectric conversion device according to any one of claims 2, 4, or 5, wherein the concentration of the P-type impurity in the third non-single-crystal semiconductor layer is above $10^{18}$ atoms/cm$^3$, wherein the P-type impurity introduced into the second non-single-crystal semiconductor layer is boron and has a concentration in the range of $2\times10^{15}$ to $2\times10^{17}$ atoms/cm$^3$ at one end of the second layer adjoining the third non-single-crystal semiconductor layer, and wherein the ratio of the concentration of the P-type impurity in the second non-single-crystal semiconductor layer at the other end thereof adjoining the first non-single-crystal semiconductor to the P-type impurity concentration in the second layer at the said one end thereof is in the range of 1/10 to 1/100.

15. A photoelectric conversion device according to claim 14, wherein the third non-single-crystal semiconductor layer has a larger energy band gap than does the second non-single-crystal semiconductor layer.

16. A photoelectric conversion device according to claim 15, wherein the third non-single-crystal semiconductor layer is formed of $Si_xC_{1-x}$ [(] where $0<x<1$[)], and wherein the second non-single-crystal semiconductor layer is formed of silicon.

* * * * *